(12) United States Patent
Lee

(10) Patent No.: US 10,067,180 B2
(45) Date of Patent: Sep. 4, 2018

(54) SEMICONDUCTOR DEVICE, METHOD OF MANUFACTURING A SEMICONDUCTOR DEVICE AND APPARATUS FOR TESTING A SEMICONDUCTOR DEVICE

(71) Applicant: Samsung Electronics Co., Ltd., Suwon-si (KR)

(72) Inventor: Junhee Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 397 days.

(21) Appl. No.: 14/737,506

(22) Filed: Jun. 12, 2015

(65) Prior Publication Data

US 2016/0047857 A1 Feb. 18, 2016

(30) Foreign Application Priority Data

Aug. 14, 2014 (KR) .......................... 10-2014-0106105

(51) Int. Cl.
*G01R 31/28* (2006.01)
(52) U.S. Cl.
CPC .............................. *G01R 31/2891* (2013.01)
(58) Field of Classification Search
CPC ................................................ G01R 31/2891
USPC .... 324/750.22–750.26, 500, 754.01–754.21, 324/690, 696
See application file for complete search history.

(56) References Cited

U.S. PATENT DOCUMENTS

| 5,644,245 | A | * | 7/1997 | Saitoh | G01R 1/06794 324/750.18 |
|---|---|---|---|---|---|
| 6,297,656 | B1 | | 10/2001 | Kobayashi et al. | |
| 6,420,892 | B1 | | 7/2002 | Krivy et al. | |
| 6,600,329 | B2 | | 7/2003 | Lee | |
| 6,720,789 | B1 | | 4/2004 | Audette et al. | |
| 6,791,344 | B2 | | 9/2004 | Cook et al. | |
| 6,965,432 | B2 | | 11/2005 | Wu et al. | |
| 8,222,912 | B2 | | 7/2012 | Dang et al. | |
| 8,600,693 | B1 | | 12/2013 | Kennamer | |
| 8,700,963 | B2 | | 4/2014 | Whetsel | |
| 9,600,693 | B2 | | 3/2017 | Klum et al. | |
| 2002/0191140 | A1 | * | 12/2002 | Eguchi | G02F 1/1309 349/149 |
| 2003/0237061 | A1 | * | 12/2003 | Miller | G01R 31/2886 438/18 |

(Continued)

FOREIGN PATENT DOCUMENTS

| KR | 10-0445931 | 10/2004 |
|---|---|---|
| KR | 10-1095781 | 12/2011 |
| KR | 10-1199733 | 11/2012 |

*Primary Examiner* — Melissa Koval
*Assistant Examiner* — Trung Nguyen
(74) *Attorney, Agent, or Firm* — Muir Patent Law, PLLC

(57) ABSTRACT

Provided is a semiconductor device including a substrate, insulating layers on the substrate, interconnection lines in or between the insulating layers, and pads on the insulating layers. The pads may include signal pads connected to the interconnection lines, and measurement pads disposed spaced apart from the signal pads and electrically connected to corresponding ones of the signal pads by the interconnection lines. Misalignment of probes contacting the semiconductor device may be detected by detecting a signal communicated between one or more of the measurement pads and the signal pads.

20 Claims, 10 Drawing Sheets

(56) References Cited

U.S. PATENT DOCUMENTS

2012/0126843 A1    5/2012  Shibahara
2012/0139535 A1    6/2012  Watanabe
2013/0335109 A1   12/2013  Chen et al.
2015/0366049 A1*  12/2015  Lee .................... G02F 1/13458
                                                           361/749

* cited by examiner

SEMICONDUCTOR DEVICE, METHOD OF MANUFACTURING A SEMICONDUCTOR DEVICE AND APPARATUS FOR TESTING A SEMICONDUCTOR DEVICE

CROSS-REFERENCE TO RELATED APPLICATIONS

This U.S. non-provisional patent application claims priority under 35 U.S.C. § 119 to Korean Patent Application No. 10-2014-0106105, filed on Aug. 14, 2014, in the Korean Intellectual Property Office, the entire contents of which are hereby incorporated by reference.

BACKGROUND OF THE INVENTION

Example embodiments of the inventive concept relate to a semiconductor device, and in particular, to a semiconductor device configured to reduce an alignment error between its pad structure and a probe card, a method of testing the same, and an apparatus for testing the same.

As information and communication technologies develop, various types of semiconductor devices are being studied and developed. Since not only performance and but also reliability are important factors for the semiconductor device, a test process is performed to evaluate reliability of a semiconductor device, before being sold. In the test process, probes are used to provide electric signals or power for the test process to a semiconductor device or obtain a test data from the semiconductor device. Accordingly, to normally perform the test process, the probes should be in contact with pads of the semiconductor device. However, as sizes of the pads in semiconductor devices decrease, aligning the probes to the pads becomes harder and harder.

SUMMARY

Example embodiments of the inventive concept provide a semiconductor device whose pads can be easily aligned with probes, a method of testing the same, and an apparatus for testing the same.

Other example embodiments of the inventive concept provide a semiconductor device whose pads can be three-dimensionally aligned with probes, a method of testing the same, and an apparatus for testing the same.

According to example embodiments of the inventive concept, a semiconductor device may include a substrate, insulating layers on the substrate, interconnection lines in or between the insulating layers, and pads on the insulating layers. The pads may include signal pads connected to the interconnection lines, and alignment pads disposed spaced apart from the signal pads and electrically connected to the signal pads by the interconnection lines. The alignment pads may be disposed at positions corresponding alignment errors between centers of the signal pads and probes to be in contact with the signal pads.

According to example embodiments of the inventive concept, a method of testing a semiconductor device may include aligning a probe card including probes with a substrate including signal pads and alignment pads connected to the signal pads, respectively, aligning the probes with the signal pads to bring the probes into contact with the signal pads, and testing the substrate. The aligning the probes with the signal pads may include determining an alignment error of the probes, which are in contact with the alignment pads, using the signal pads.

According to example embodiments of the inventive concept, an apparatus for testing a semiconductor device may include a chuck supporting a substrate, in which signal pads and alignment pads connected to the signal pads, respectively, are provided, a probe card including a plurality of probes to be in contact with the signal and alignment pads, a tester configured to input/output a test signal to/from the substrate through the probe card, and an alignment module aligning the probes with centers of the signal pads, in consideration of an alignment error of the probes with respect to the centers of the signal pads. The alignment error may be obtained by examining positions of the alignment pads and the probe, which are in contact with each other, using the signal pads.

In some examples, a semiconductor device, may comprise an integrated circuit; an insulating layer; a plurality of signal pads on the insulating layer, at least some of which are connected to communicate signals between an external source and the integrated circuit; a plurality of probe measurement pads on the insulating layer, the plurality of probe measurement pads being spaced apart and insulated from each other by at least the insulating layer so that they are not electrically connected to each other within the semiconductor device, each of the plurality of probe measurement pads being electrically connected to a corresponding one of the signal pads, each of the probe measurement pads being configured to be brought into contact with an external probe to communicate an electrical signal between the external probe and the corresponding one of the signal pads to which it is connected.

The plurality of signal pads and plurality of probe measurement pads may be formed of the same metal material at the same height in the semiconductor device.

The plurality of signal pads and plurality of probe measurement pads may be exposed from the insulating layer, and the insulating layer is the uppermost insulating layer of the semiconductor device.

At least a majority of the plurality of signal pads has a first area as viewed from a top down perspective, and the plurality of probe measurement pads comprise an array of probe measurement pads positioned in a region substantially equal to the first area.

The array of probe measurement pads may comprise at least nine probe measurement pads.

A measurement pad may have a ring shape surrounding the array of probe measurement pads.

The probe measurement pads may comprise a vertical stack of measurement pads embedded within the insulating layer.

In a method of manufacturing a first semiconductor device comprising an integrated circuit; an insulating layer; a plurality of signal pads on the insulating layer, at least some of which are connected to communicate signals between an external source and the integrated circuit; a plurality of probe measurement pads on the insulating layer, each of the plurality of probe measurement pads being electrically connected to a corresponding one of the signal pads, the method may comprise: bringing a plurality of probes of a probe card into contact with the plurality of the signal pads and at least one of the measurement pads; determining which of the measurement pads is in contact with a first probe of the plurality of probes by detecting a signal between a probe in contact with one of the signal pads and the first probe; and adjusting a position of the probe card in response to the determining step.

The method may comprise testing the first semiconductor device by providing test signals to the integrated circuit of the first semiconductor device via the probe card, wherein the adjusting the position of the probe card is performed prior to the testing the first semiconductor device.

The method may comprise testing the first semiconductor device by providing test signals to the integrated circuit of the first semiconductor device via the probe card, then testing a second semiconductor device by providing test signals to an integrated circuit of the second semiconductor device via the probe card, wherein the adjusting the position of the probe card is performed after testing the first semiconductor device and prior to the testing the second semiconductor device.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
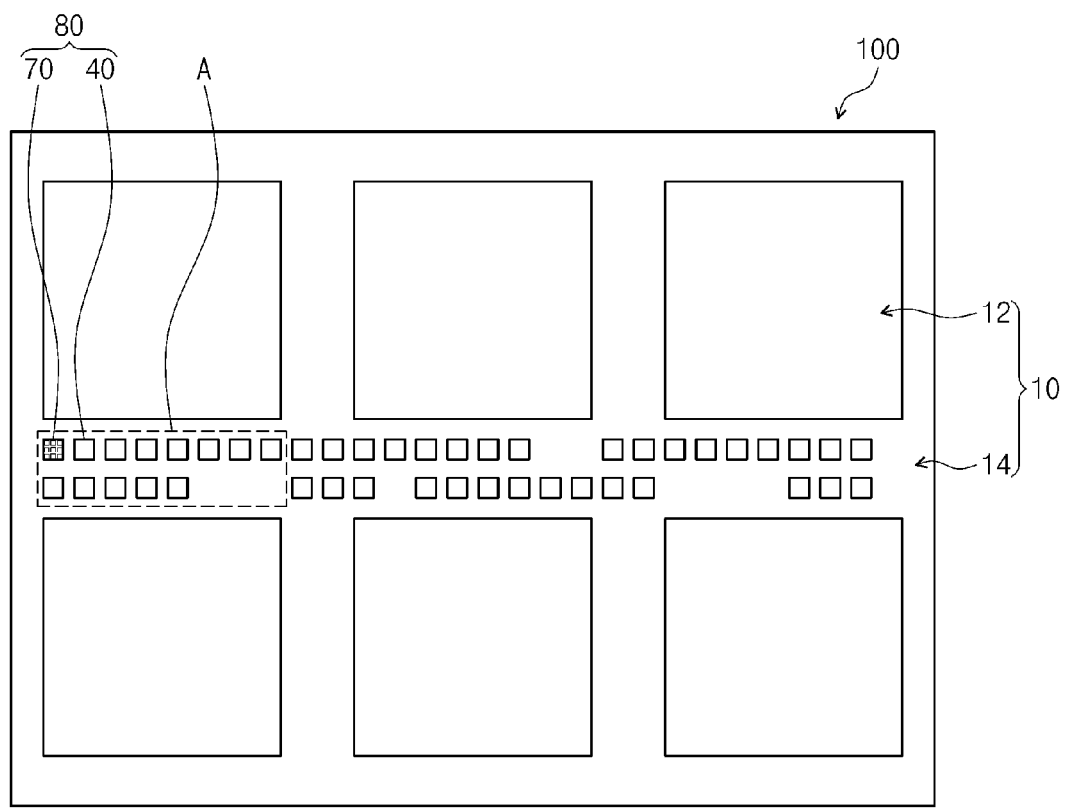
FIGS. 1 through 4 are plan views illustrating a semiconductor device according to example embodiments of the inventive concept.

It should be noted that these figures are intended to illustrate the general characteristics of methods, structure and/or materials utilized in certain example embodiments and to supplement the written description provided below. However, these drawings may not be to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and thus duplication of their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. More-over, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 4 are plan views illustrating a semiconductor device according to example embodiments of the inventive concept. According to example embodiments of the inventive concept, as shown in FIGS. 1 through 4, a semiconductor device 100 may include a substrate 10 and pads 80, which are disposed on the substrate 10.

The semiconductor device 100 may be provided in a form of a chip die, which may be formed by singulating (e.g., sawing) a semiconductor wafer. The substrate 10 may comprise a crystalline homogenous monolithic semiconductor material. The substrate 10 may be a part of the semiconductor wafer. Testing of the semiconductor device 100 may occur after or prior to separating the semiconductor device 100 from the wafer. The substrate 10 may include core regions 12 and a peripheral region 14. In each of the core regions 12, a plurality of unit devices (e.g., 16 in FIG. 7, which may be e.g., portions of integrated circuits or memory cells) may be provided. The peripheral region 14 may be provided adjacent or around the core regions 12. For example, the peripheral region 14 may be positioned between the core regions 12. The peripheral region 14 may be configured to include interconnection lines, which are connected to respective unit devices of the core regions 12 and/or other unit devices (e.g., unit devices in the peripheral region 14).

The pads 80 may be disposed on the peripheral region 14 of the substrate 10. The pads 80 may be connected to the unit device (e.g., 16 of FIG. 7) through the interconnection lines (e.g., 30 of FIG. 7). In example embodiments, the pads 80 may be arranged to form two columns. For example, in the case where the semiconductor device 100 is a DRAM chip, the semiconductor device 100 may have about 30-50 pads 80 which are arranged to form two columns. In example embodiments, the pads 80 may include signal pads 40 and alignment pads 70. The signal pads 40 may be connected to respective ones of the interconnection lines 30 and the unit devices 16. Each of the signal pads 40 may be shaped like a rectangle or square, when viewed in a plan view.

As shown in FIGS. 1-8, the alignment pads 70 may be spaced apart from the signal pads 40. The alignment pads 70 and the signal pads 40 may be disposed on a central region of the substrate 10 or on the peripheral region 14 between the core regions 12. Further, the alignment pads 70 may be disposed at a side of the signal pads 40. The alignment pads 70 and the signal pads 40 may be arranged in the same regular pattern and be spaced apart from each other with the same pitch. The alignment pads 70 may have substantially the same size and shape as each of the signal pads 40. Alternatively, the alignment pads 70 may have a different size and from one or more of the signal pads. For example, each alignment pad 70 may be larger than each of the signal pads or larger than neighboring signal pads so that, during testing, a misalignment of probes to corresponding signal pads 40 that results in lack of contact between the same may be detected by the alignment pad 70 (as will be apparent from the discussion below).

Figure 2:
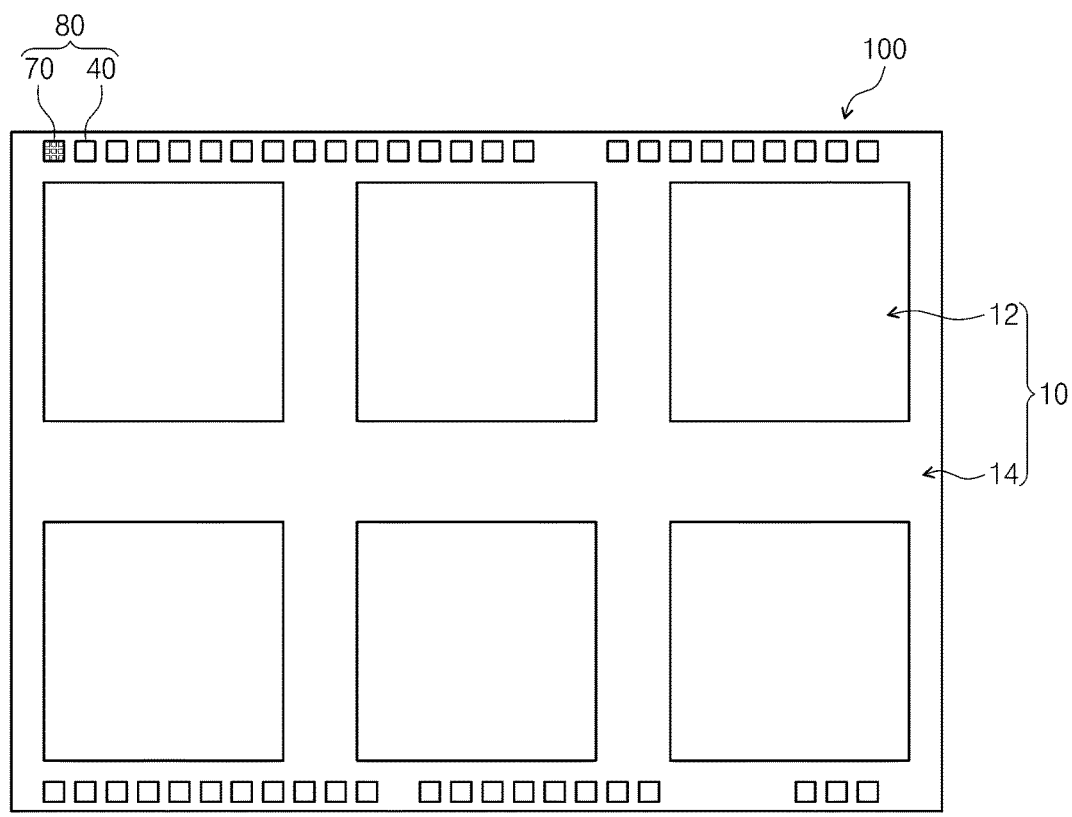

Referring to FIG. 2, the signal pads 40 may be arranged on opposite edge portions of the peripheral region 14, which are positioned at opposite edges of the substrate 10. For example, the signal pads 40 may be arranged so that only a single column is formed on each of the opposite edge portions of the peripheral region 14. In certain embodiments, the alignment pad 70 may be disposed at one of the edge portions of the peripheral region 14. For example, the alignment pad 70 may be the outermost one of the pads 80 or may be disposed near one of the corners of the substrate 10.

Figure 3:
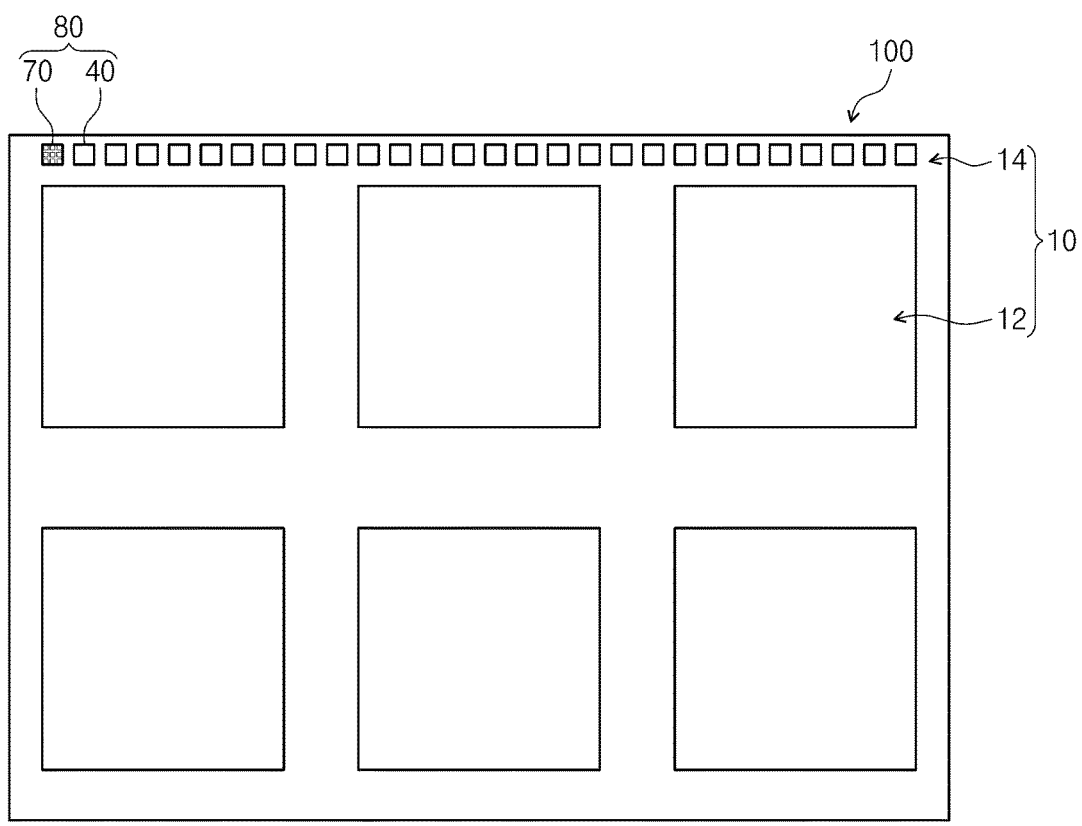
Figure 4:
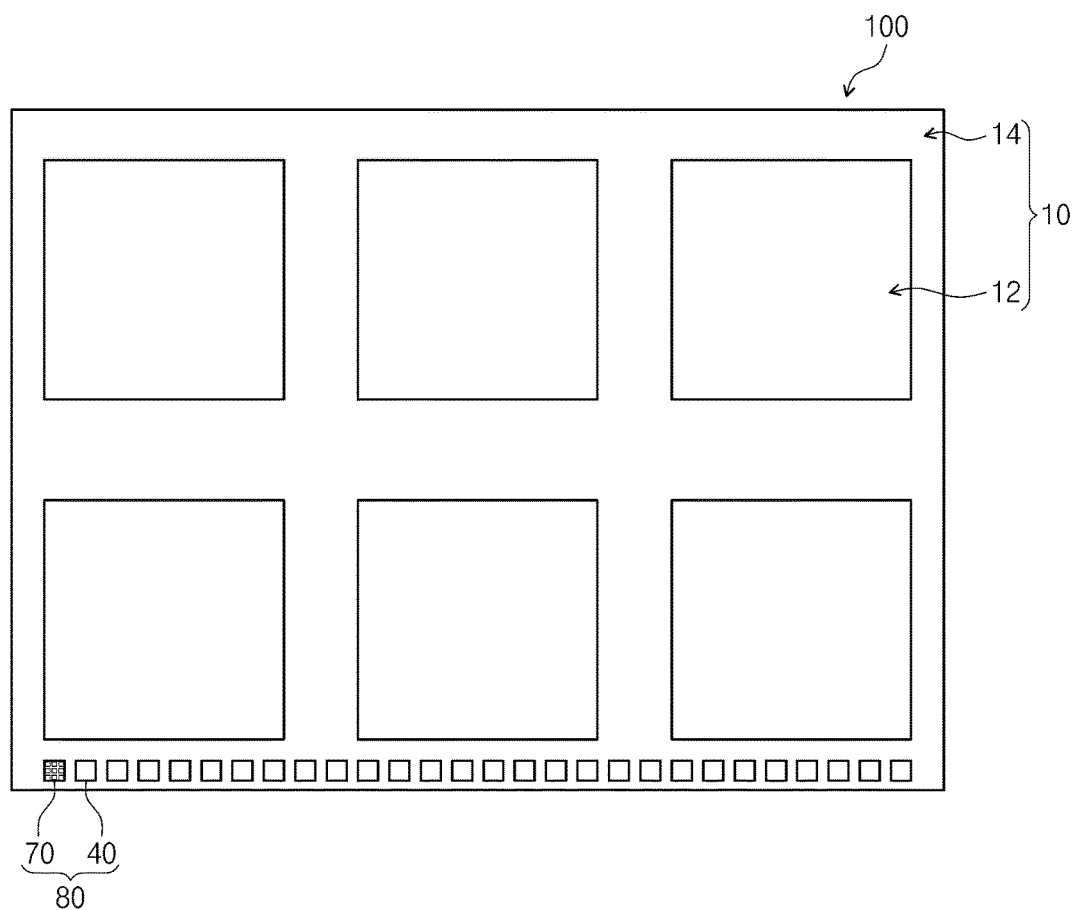

Referring to FIGS. 3 and 4, the signal pads 40 may be arranged so that only a single column is formed on only a single edge of the peripheral region 14 or the substrate 10. In other embodiments, the pads (40, 70) may be arranged in columns at outer edges and arranged in the center (e.g., a combination of the pad arrangement of FIGS. 1 and 2). As another example, the arrangements of FIGS. 1 to 4 may be modified to also include vertically aligned columns of pads (40, 70), such as on the left and/or right sides of the semiconductor device 100. In the examples of FIGS. 1-4, the alignment pad 70 may be the outermost one of the pads 80 or may be disposed near one of the corners of the substrate 10, but example embodiments of the inventive concept may not be limited thereto. In the case where the semiconductor device 100 is a NAND FLASH memory chip, the semiconductor device 100 may have about 20-40 pads 80, which are arranged to form a single column, as shown in FIGS. 3 and 4.

Figure 5:
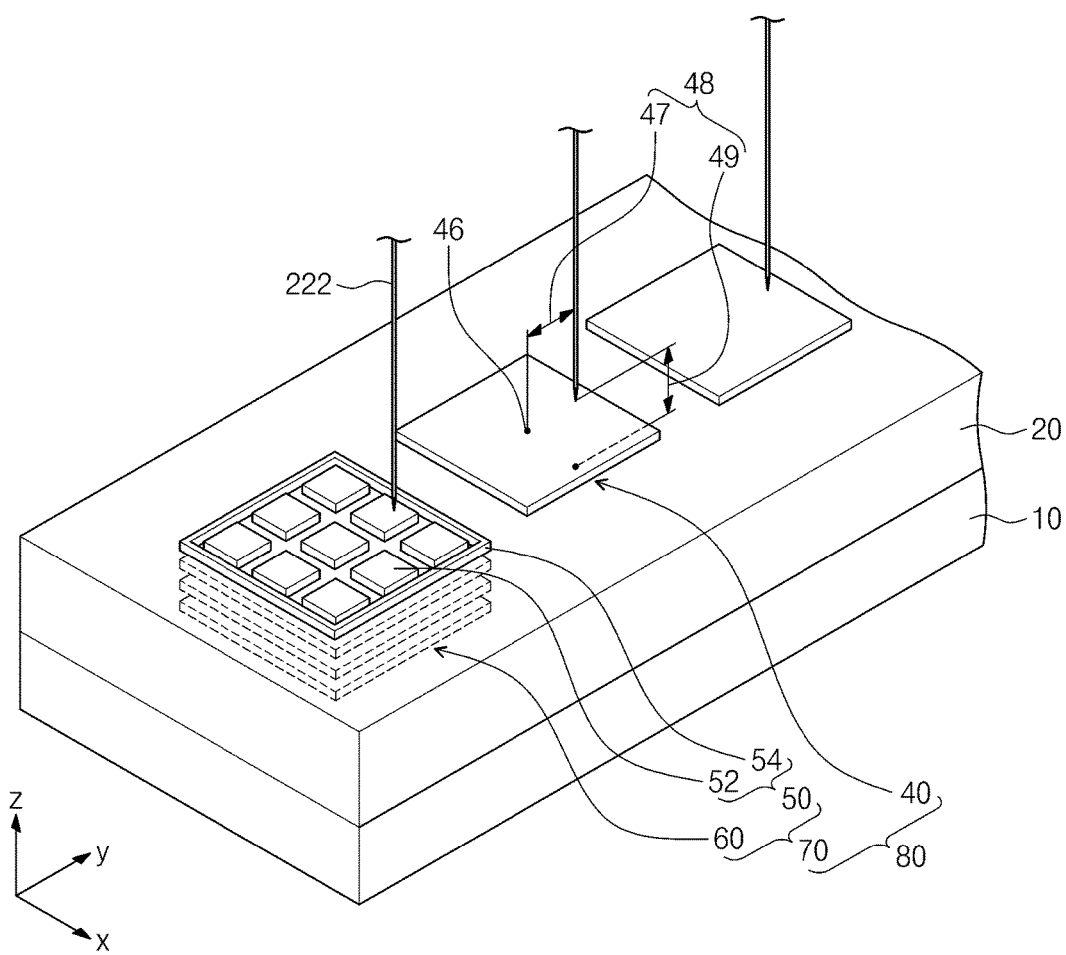
FIG. 5 is a perspective view illustrating a semiconductor device, in which pads to be in contact with probes are provided, according to example embodiments of the inventive concept.

FIG. 5 is a perspective view illustrating a semiconductor device, in which pads to be in contact with probes are provided, according to example embodiments of the inventive concept. Referring to FIG. 5, the pads 80 may be provided on an insulating layer 20 covering the substrate 10. The uppermost layer (e.g., upper most metal layer) of pads 80 are shown as raised above the uppermost surface of insulating layer 20. However, this uppermost layer may be formed within a depression or opening in the insulating layer 20. For example, the uppermost layer may be formed by etching a pattern into the insulating layer 20, depositing one or more conductive layers (e.g., one or more metal layers) over the surface of the insulating layer 20 and within openings formed therein due to the etch, and performing a chemical-mechanical planarization on the conductive layer (s) to expose the insulating layer 20 so that conductive layer(s) remaining in the opening form pads 80 (and may have upper surfaces flush with the upper surface of the insulating layer 20).

During a process of testing the semiconductor device, probes 222 (for example, of external test equipment) may be in contact with the pads 80, respectively. For example, the probes 222 may be in contact with the alignment pads 70 and the signal pads 40. It is desirable that each of the probes 222 should contact a center 46 of a corresponding one of the pads 80. However, in some cases, the substrate 10 may be been deformed by or have its location altered by, for example, a change in temperature of a testing process. In such a case, it may be difficult to exactly align the probes 222 to the pads 80. That is, the test process may suffer from a misalignment between the probes 222 and the pads 80.

The probes 222 may be arranged to be in contact with the alignment and signal pads 70 and 40, respectively, at the same relative position thereof. Contacting the pads with probes at the same relative position may be for all the pads 40 of the semiconductor device 100, or just for those pads 40 that are nearby pad 70. For example, if the probes 222 are misaligned from the centers 46 of the signal pads 40, a center of the alignment pad 70 and a corresponding one of the probes 222 may also be misaligned to substantially the same extent and direction. This may result from positioning the probes 222 of the testing device to have the same positioning as the pad layout as designed in the semiconductor device 100. Misalignment of the pads 40 and probes 222 may occur globally for all the pads 40 due to failure to correctly position the probe card (having the probes 222) with respect to the semiconductor device. Such misalignment may occur due to expansion or shrinkage of the testing platform (e.g., a chuck, such as chuck 210 described below) on which the semiconductor device 100 is mounted (due to temperature changes causing a movement of this testing platform, e.g.). In addition or in the alternative, misalignment may occur differently for different parts of the semiconductor device 100 (e.g., with respect to a left edge and right edge of the semiconductor device) due to an expansion and shrinkage of the semiconductor device itself due temperature changes, e.g. (in such a case, however, the relative alignment of neighboring pads may be expected to be substantially the same, but change incrementally from pad to neighboring pad to pad so that a significant change may exist as compared to different sides of the semiconductor device 100). When misalignment changes differently for different parts of the semiconductor device, the misalignment for each pad 40 may be inferred from an interpolation and/or extrapolation (e.g., linear interpolation or linear extrapolation) of the detected misalignment of multiple probes 222 from the center of the corresponding alignment pad 70. Further, at least one or all of the probes 222 may be inserted into the pads 80 or the insulating layer 20 to a specific depth (for example, to the same depth), when the testing process is performed.

The alignment pads 70 may be used to determine information on positions of the probes 222 in contact with the pads 80. For example, the alignment pads 70 may be used to obtain information on an alignment error 48 of the probes 222. Here, the alignment error 48 may provide data indicating a difference in position between the centers 46 of the pads 80 and the probes 222 and may be obtained by providing and receiving an electrical signal. In particular, a misalignment of a probe in contact with a first alignment pad 70 from the center of the alignment pad 70 may be determined by detecting an electrical signal, and this misalignment may be used to infer a similar misalignment of probes 222 from the center (and/or correct depth of contact) of corresponding pads 40 to which the probes 222 are in contact. For example, when one alignment pad 70 is implemented in a semiconductor device 100, it may be assumed that all probes 222 are misaligned the same amount and same distance as that detected with respect to the one alignment pad 70. When plural alignment pad 70 is implemented in a semiconductor device 100, the misalignment of the plural alignment pads 70 may be used to infer a misalignment by an interpolation and/or extrapolation of the misalignment amount (in each of the x, y and z directions) of the plural alignment pads (e.g., liner interpolation/extrapolation as a function of a distance). In example embodiments, the alignment error 48 may contain an in-plane alignment error 47 and a depth alignment error 49. The in-plane alignment error 47 may be a difference in relative position of the probes 222 with respect to the centers 46 of the pads 80, which is measured in a plane or direction parallel to a top surface of the substrate 10. The depth alignment error 49 may be a difference between actual depths of the probes 222 and a predetermined (e.g., desired) depth, which is measured in a vertical direction (i.e., normal to the top surface of the substrate 10).

In example embodiments, the alignment pads 70 may include XY-measuring pads 50 and Z-measuring pads 60. The XY-measuring pads 50 may be disposed on the insulating layer 20. The XY-measuring pads 50 may be formed at the same level as pads 40 and may comprise the same metal layer and be formed using the same process (e.g., using the same patterning process, such as a damascene process) as the pads 40. The XY-measuring pads 50 may be used to measure the in-plane alignment error 47 of the probes 222. The XY-measuring pads 50 may include, for example, a plurality of array pads 52 and at least one boundary pad 54. The Z-measuring pads 60 may be disposed in the insulating layer 20. For example, the Z-measuring pads 60 may comprise a stack of pads buried within the insulating layer 20 and insulated from one another with an insulating layer disposed between each of these pads. The Z-measuring pads 60 may be used to measure the depth alignment error 49 of the probes 222.

Figure 6:
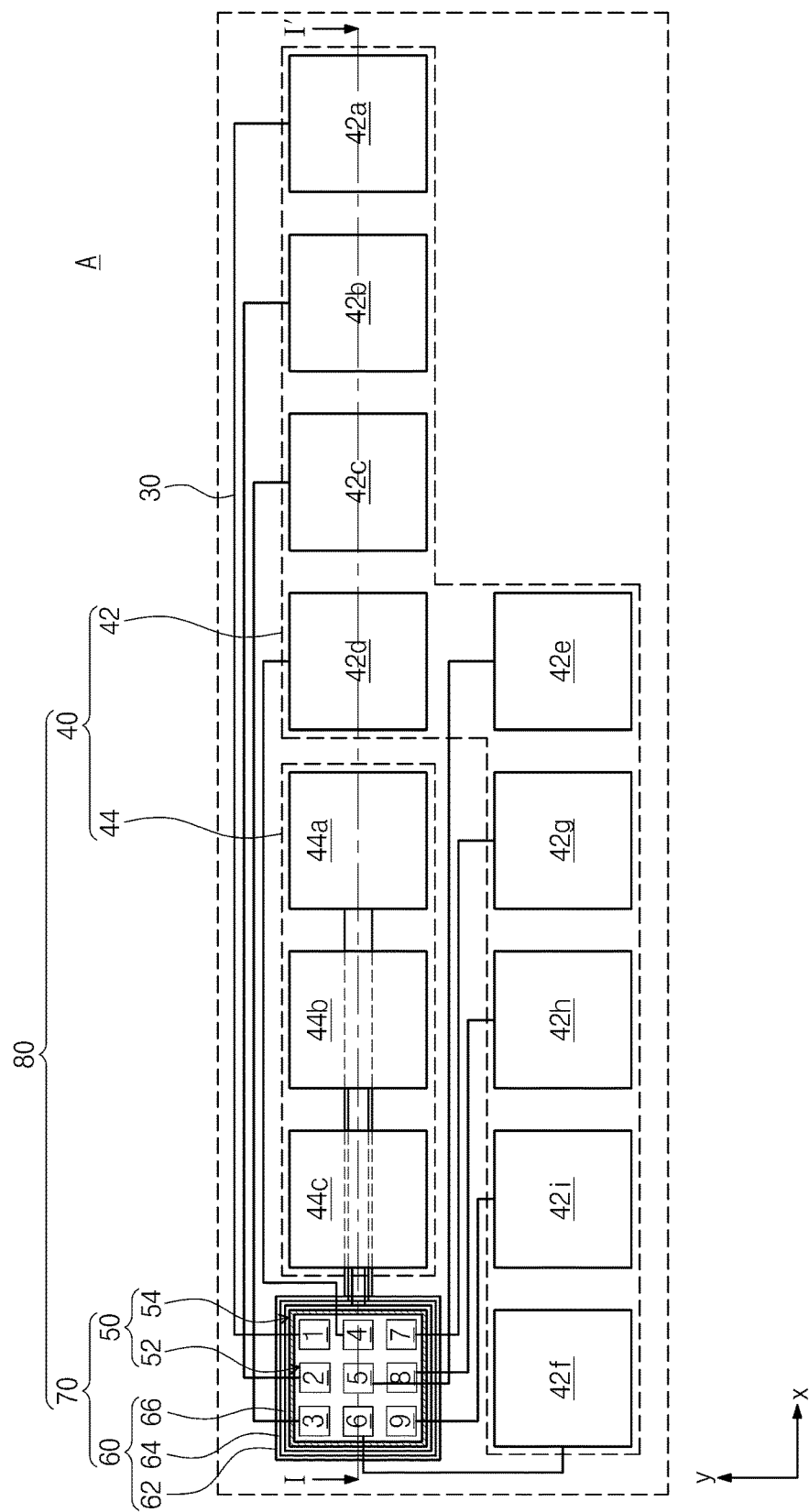
FIG. 6 is an enlarged plan view of a portion A of FIG. 1.
Figure 7:
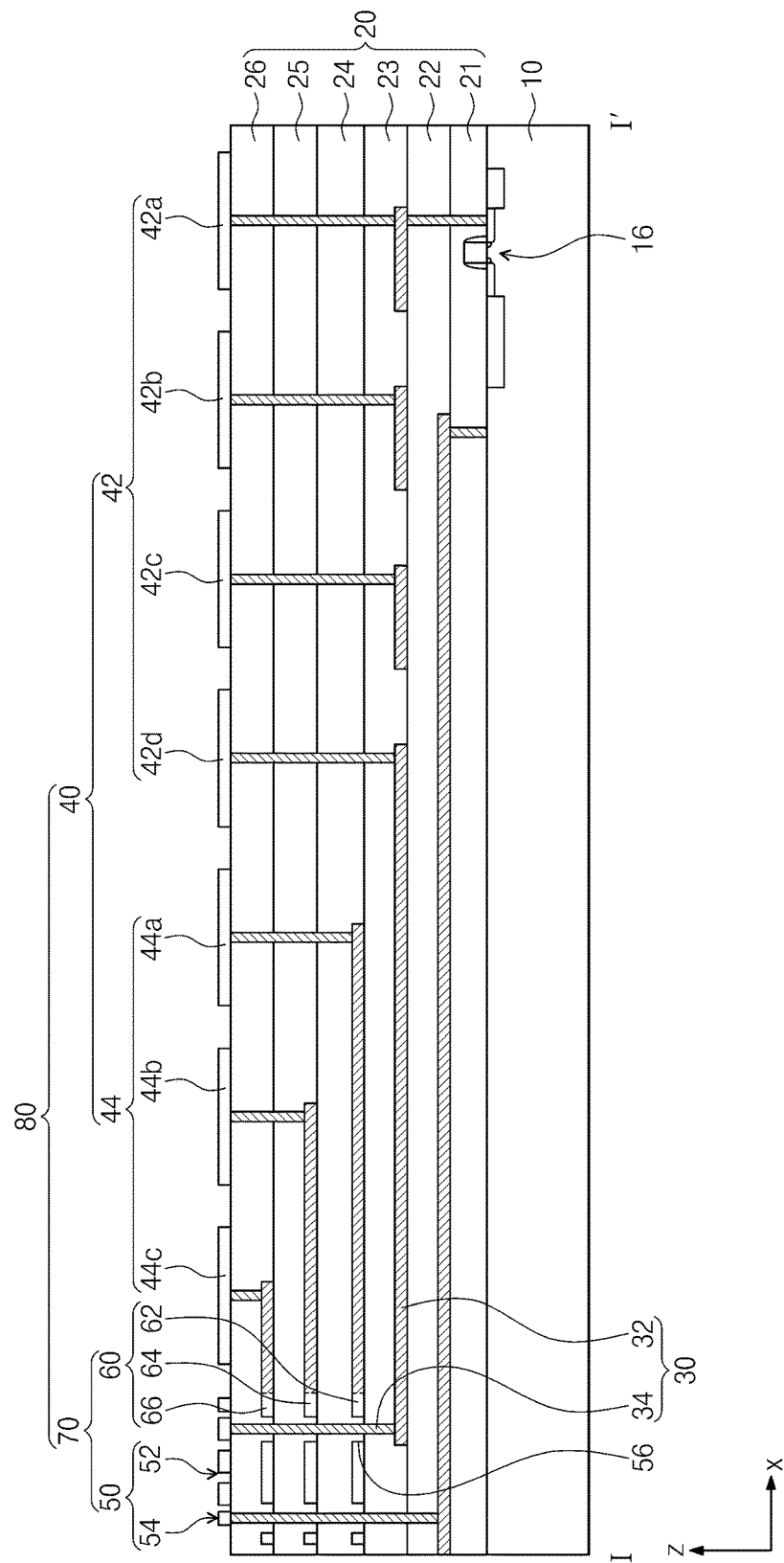
FIG. 7 is a sectional view taken along line I-I' of FIG. 6.

FIG. 6 is an enlarged plan view of the portion A of FIG. 1 and FIG. 7 is a sectional view taken along line I-I' of FIG. 6.

Referring to FIGS. 6 and 7, the alignment pad 70 is shown to comprise a plurality of smaller signal pads insulated from one another, including in this example, XY measuring pads 50 and Z measuring pads 60. Each of the XY measuring pads 50 and Z measuring pads 60 may be connected to a separate, corresponding one of the signal pads 40 by interconnection lines 30. The signal pads 40 may include XY signal pads 42 and Z signal pads 44. The XY signal pads 42 may be connected to a corresponding one of the XY-measuring pads 50. The Z signal pads 44 may be connected to a corresponding one of the Z-measuring pads 60. Hereinafter, the XY-measuring pads 50 and the XY signal pads 42 will be described, and then, the Z-measuring pads 60 and the Z signal pads 44 will be described.

Each of the array pads 52 of the XY-measuring pads 50 may be electrically connected to a corresponding one of the signal pads 40. The array pads 52 of an alignment pad may be arranged across an area that is substantially equal to that of one of the signal pads 40. The area that array pads 52 are arranged may have substantially the same shape as each of the signal pads 40. Each of the array pads 52 may be disposed to allow a testing apparatus to quantitatively examine the in-plane alignment error 47. For example, the array pads 52 may include first to ninth outer pads 1-9. In example embodiments, the first to ninth outer pads 1-9 may be disposed to form a 3×3 matrix-shaped arrangement. Here, the fifth outer pad 5 may represent that there is no in-plane alignment error with respect to a probe contacting the corresponding alignment pad 70. In the case where the centers of the first to ninth outer pads 1-9 are spaced apart from each other by about 1 μm in both of x and y directions, the first outer pad 1 may represent that the in-plane alignment error 47 of about 1 µm occurs in both of x and y directions. The ninth outer pad 9 may represent that the in-plane alignment error 47 of about −1 µm occurs in both of x and y directions.

In example embodiments, the array pads 52 may be respectively connected to the XY signal pads 42 and may be used to examine a mode or aspect of the in-plane alignment error 47 between the signal pads 40 and the probes 222. For example, the XY signal pads 42 may include first to ninth XY signal pads 42a-42i, which may be respectively connected to the first to ninth outer pads 1-9. Thus, for example, if the probe 222 is in contact with the first outer pad 1, the probe 222 can be electrically connected to the first XY signal pad 42a. Accordingly, by measuring a current flowing through the first XY signal pad 42a, it is possible to determine that a probe 222 is in contact with alignment pad 70 but not aligned with the center of alignment pad 70. Based on this determination, it may be inferred fi that other the probes 222 are similarly misaligned (e.g., in contact with the pads 40 but misaligned from the centers 46 of the pads 40, respectively, by 1 µm in both of x and y directions).

In the case where the probe 222 is in contact with the fifth outer pad 5, the probe 222 may be electrically connected to the fifth XY signal pad 42e through the fifth outer pad 5 and at least one of the interconnection lines 30. Thus, by measuring a current flowing through the fifth XY signal pad 42e, it is possible to determine that a probe 222 is aligned with the center of alignment pad 70 and infer that other ones of the probes 222 are in contact with the centers 46 of the pads 80 without misalignment.

A boundary pad 54 may be provided to enclose the array pads 52. In certain embodiments, the boundary pad 54 may be shaped like a rectangular ring. The boundary pad 54 may encompass an area larger than each of the signal pads 40. The boundary pad 54 may be grounded through at least one of the interconnection lines 30.

The XY-measuring pads 50 and the signal pads 40 may be provided on the insulating layer 20. The insulating layer 20 may include, for example, first to sixth interlayer insulating layers 21-26, which are sequentially stacked on the substrate 10. The XY-measuring pads 50 and the signal pads 40 may be provided on the sixth interlayer insulating layer 26, which is the uppermost one of the first to sixth interlayer insulating layers 21-26.

The interconnection lines 30 may be provided in the insulating layer 20. In example embodiments, the interconnection lines 30 may include interconnection layers 32 (e.g., horizontal wiring) and contact plugs 34. The interconnection layers 32 may be provided between the first to sixth interlayer insulating layers 21-26, and each of the contact plugs 34 may be provided to penetrate at least one of the first to sixth interlayer insulating layers 21-26. The contact plugs 34 may connect the interconnection layers 32 electrically to corresponding pads 80. The XY-measuring pads 50 may be connected to the XY signal pads 42, respectively, through the interconnection layers 32 and the contact plugs 34. Each of the contact plugs 34 may be connected to a corresponding one of the first to ninth outer pads 1-9 and the first to ninth XY signal pads 42a-42i. The interconnection layers 32 between the second and third interlayer insulating layers 22 and 23 may be connected to the contact plugs 34. The first to ninth outer pads 1-9 may be connected to the first to ninth XY signal pads 42a-42i, respectively, through the interconnection layers 32 and the contact plugs 34. In addition, at least one of the XY signal pads 42 may be connected to the unit device 16. At least one of the XY signal pads 42 may be connected to the unit device 16 via the contact plugs 34. The unit device 16 may include a thin-film transistor, a capacitor, a diode, or a resistor. The unit device 16 may form part of the integrated circuit of the semiconductor device 100. The unit device 16 may be part of an input/output buffer that receives information for processing by the semiconductor device, such as commands, addresses and/or data. The unit device 16 may form part of an internal power supply or power regulating circuit that receives a positive, negative or reference potential to supply power to the integrated circuit of the semiconductor device.

The Z-measuring pads 60 may be provided in the insulating layer 20. In example embodiments, the Z-measuring pads 60 may be provided below the XY-measuring pads 50. The Z-measuring pads 60 may include first to third inner pads 62, 64 and 66, which are disposed spaced apart from the signal pads 40 and are used to examine a mode or aspect of the depth alignment error 49. The first inner pad 62 may be disposed between the third interlayer insulating layer 23 and the fourth interlayer insulating layer 24. The second inner pad 64 may be disposed between the fourth interlayer insulating layer 24 and the fifth interlayer insulating layer 25. The third inner pad 66 may be disposed between the fifth interlayer insulating layer 25 and the sixth interlayer insulating layer 26. The first to third inner pads 62-66 may be sequentially stacked on the substrate 10, in the order enumerated.

In example embodiments, the Z-measuring pads 60 may be electrically connected to the Z signal pads 44 and thereby be used to examine a mode or aspect of the depth alignment error 49 between the signal pads 40 and the probes 222. For example, the Z signal pads 44 may include first to third Z signal pads 44a-44c connected to the first to third inner pads 62-66, respectively. In the case where the probe 222 is in contact with the first inner pad 62, it may be electrically connected to the first Z signal pads 44a, and thus, by measuring a current flowing through the first Z signal pads 44a, it is possible to determine the vertical position of the probes 222.

The interconnection layers (e.g., horizontal wiring) 32 may be laterally extended from the Z-measuring pads 60. Thus, the contact plugs 34 may be electrically connected to the Z signal pads 44. In other words, the Z-measuring pads 60 may be electrically connected to the Z signal pads 44 through the interconnection layers 32 and the contact plugs 34.

The interconnection layers 32 may be extended from the contact plug 34 connected to the Z signal pads 44 to the Z-measuring pads 60 in a direction parallel to the top surface of the substrate 10. The interconnection layers 32 extended from the first inner pad 62 may be connected to the first Z signal pad 44a through a corresponding one of the contact plugs 34. The interconnection layer 32 extended from the second inner pad 64 may be connected to the second Z signal pad 44b through a corresponding one of the contact plugs 34. The interconnection layer 32 extended from the third inner pad 66 may be connected to the third Z signal pad 44c through a corresponding one of the contact plugs 34.

The contact plugs 34 connected to the XY-measuring pads 50 may penetrate the Z-measuring pads 60. For example, each of the Z-measuring pads 60 may be formed to have at least one hole 56, and the contact plugs 34 may be disposed to pass through the holes 56. The Z-measuring pads 60 and the contact plugs 34 may be electrically separated from each other by the insulating layer 20 provided in the holes 56. The interconnection lines 30 may be provided in the insulating layer 20 to connect the measuring pads 50, 60 to the signal pads 40 without connecting to one another or forming any electric short circuit. In some examples, when a signal pad 40 is dedicated for use to detect an electrical signal in from the alignment pad 70, it may be electrically floating within the semiconductor device 100, along with the interconnection line and the associated measuring pad 50 or 60 to which it is connected.

Example embodiments of the inventive concept are not limited to the example of the semiconductor device 100 exemplarily described with reference to FIGS. 1 through 7. In other words, variations in form and detail may be made therein without departing from the inventive concept described herein.

Figure 8:
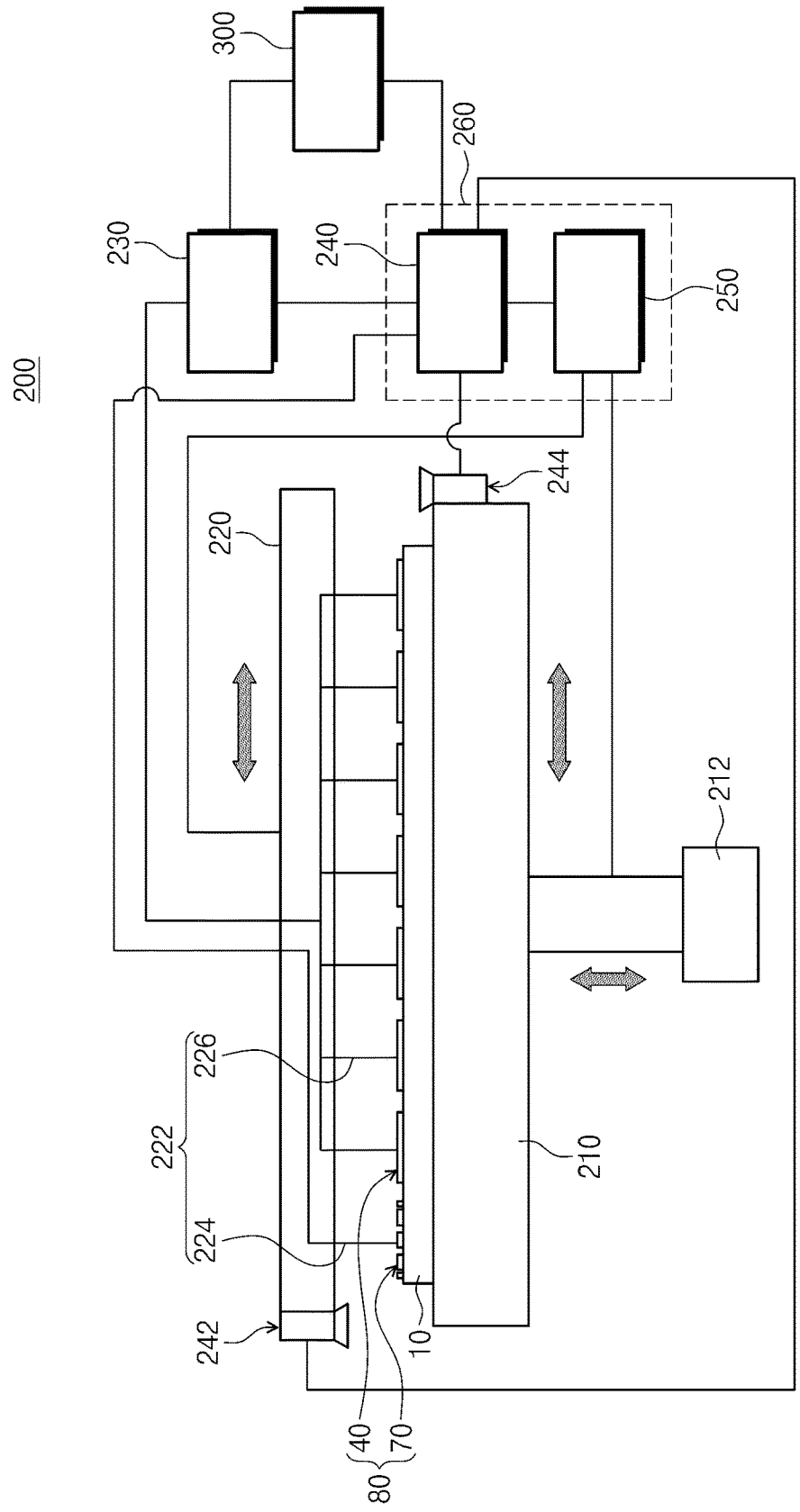
FIG. 8 is an apparatus for testing a semiconductor device of FIG. 1.

FIG. 8 is an apparatus for testing a semiconductor device of FIG. 1. A testing apparatus 200 may include test equipment, which is configured to test electrical characteristics of the semiconductor device 100. In example embodiments, the testing apparatus 200 may include a chuck 210, a probe card 220, a tester 230, and an alignment module 260.

The chuck 210 may be used to support the substrate 10. A vertical position of the chuck 210 may be changed by a lifter 212. Due to such a change in vertical position of the chuck 210, a distance between the substrate 10 and the probe card 220 may be changed in a vertical direction.

The probe card 220 may be disposed above the chuck 210. The probe card 220 may include a plurality of probes 222. The chuck 210 may be elevated so that the probes 222 are put into in contact with corresponding ones of the pads 80. The probes 222 may include at least one alignment probe 224 and a plurality of signal probes 226. The alignment probe 224 may be in contact with the a corresponding alignment pad 70. The signal probes 226 may be in contact with corresponding ones of the signal pads 40. In example embodiments, the probe card 220 may be configured in such a way that, when the pads 80 are in contact with the probes 222, the alignment probe 224 is electrically connected to one of the signal probes 226 to complete a circuit.

The probes 222 may be fastened to the probe card 220 at regularly-spaced or predetermined intervals. In example embodiments, the probe card 220 may be configured to allow each of the alignment and signal probes 224 and 226 to be in contact with a corresponding one of the alignment and signal pads 70 and 40 at the same position thereof.

In example embodiments, the tester 230 may be connected to the signal probes 226. The tester 230 may be configured to electrically test the unit device 16 at a temperature ranging, for example, from about 90° C. to about −20° C. If the unit device 16 is normally operated, the tester 230 may classify the semiconductor device 100 as a good product and send the testing data to a server 300. If the unit device 16 is abnormally operated, the semiconductor device 100 may be classified as a failed product.

The alignment module 260 may be used to align the probe card 220 with the substrate 10. In example embodiments, the alignment module 260 may include a position detection unit 240 and a position control unit 250. The position detection unit 240 may be configured to monitor positions of the probes 222 and/or the pads 80. The position control unit 250 may control a position of the probe card 220 in response to position detection signals to be transmitted from the position detection unit 240. For example, based on the position detection signals, the probe card 220 may be moved in such a way that the probes 222 are positioned on the centers 46 of the pads 80, respectively.

The position detection unit 240 may monitor positions of the probe card 220 and the substrate 10 using an optical and/or electrical method. For example, the position detection unit 240 may include first and second cameras 242 and 244 for acquiring images of the substrate 10 and the probe card 220. The position detection unit 240 may examine in-plane positions of the substrate 10 and the probe card 220, based on images acquired by the first and second cameras 242 and 244, and may generate position detection signals, which are associated with the in-plane positions of the substrate 10 and the probe card 220. The position control unit 250 may control positions of the chuck 210 and the probe card 220, based on the position detection signal output from the position detection unit 240. For example, the alignment probe 224 may be aligned with one of the array pads 52 in the boundary pad 54, using an optical position detection method.

In example embodiments, the position detection unit 240 may be connected to the alignment probe 224. The position detection unit 240 may also be connected to the tester 230, and thus, it is possible to determine which of the signal probes 226 is electrically connected to alignment probe 224. Alternatively, the position detection unit 240 may be connected to the signal probes 226. This allows the position detection unit 240 to determine three-dimensional positions of the pads 80 and the probes 222, when the alignment probe 224 is in contact with the alignment pads 70. The alignment pads 70 may be used to examine whether the alignment probe 224 has an alignment error 48.

The XY-measuring pads 50 may be used to measure the in-plane alignment error 47 of the alignment probe 224. For example, in the case where the alignment probe 224 is in contact with the alignment pads 70, by measuring an electrical signal (e.g., current or voltage) flowing through the signal pads 40, the position detection unit 240 can examine which of the measuring pads 50, 60 of the alignment pad 70 is in contact with the alignment probe 224. This makes it possible to determine a mode or aspect of the alignment error 48. The position control unit 250 may move the probes 222 in consideration of the electric alignment error 48.

For example, if the signal probe 226 and the alignment probe 224 are electrically connected to each other through the first XY signal pad 42a, the position detection unit 240 may generate a position detection signal indicating that the alignment probe 224 is in contact with the first outer pad 1. Based on the position detection signal, the position control unit 250 may determine a mode or aspect of the in-plane alignment error 47 of the alignment probe 224, which may be given by a difference in position between the first outer pad 1 and the fifth outer pad 5. Thereafter, based on the determined mode of the in-plane alignment error 47, the position control unit 250 may move the probe card 220 in such a way that the alignment probe 224 is positioned on the fifth outer pad 5. If the alignment probe 224 is exactly positioned on the fifth outer pad 5, the signal probes 226 may be positioned on or aligned with the centers 46 of the signal pads 40.

In the meantime, the Z-measuring pads 60 may be used to measure the depth alignment error 49 of the alignment probe 224. For example, in the case where the alignment probe 224 is electrically connected to the signal probe 226 through the first Z signal pad 44a, the position detection unit 240 may interpret that the alignment probe 224 reaches a depth of the first inner pad 62. Similarly, in the case where the alignment probe 224 is electrically connected to the signal probe 226 through the second Z signal pad 44b, the position detection unit 240 may interpret that the alignment probe 224 reaches a depth of the second inner pad 64. In certain embodiments, the depth of the second inner pad 64 may be set to be a normal insertion depth of the alignment probe 224. Similarly, in the case where the alignment probe 224 is electrically connected to the signal probe 226 through the third Z signal pad 44c, the position detection unit 240 may interpret that the alignment probe 224 reaches a depth of the third inner pad 66. It is noted that the probe may electrically connect to more than one measuring pad 50, 60 at any one time. For example, the probe 222 may contact more than one of the Z measurement pads 60 which may also form an electrical contact with the same the side portions of the probe 222. In this instance, it will be recognized that the probe depth corresponds to the lowest contacted Z measurement pad 60. In addition, depending on the spacing between the XY measurement pads 50 and a thickness of the end of the probe, it may be possible for the probe to contact more than one of the XY measurement pads 50 (and to use this information to detect the location of the probe as between the thus contacted measurement pads 50).

As described above, by using the pads 80 including the alignment pads 70, the probes 222 can be three-dimensionally aligned with the pads 80.

The testing apparatus 200 may be used in a process of testing the semiconductor device 100, as will be described below.

Figure 9:
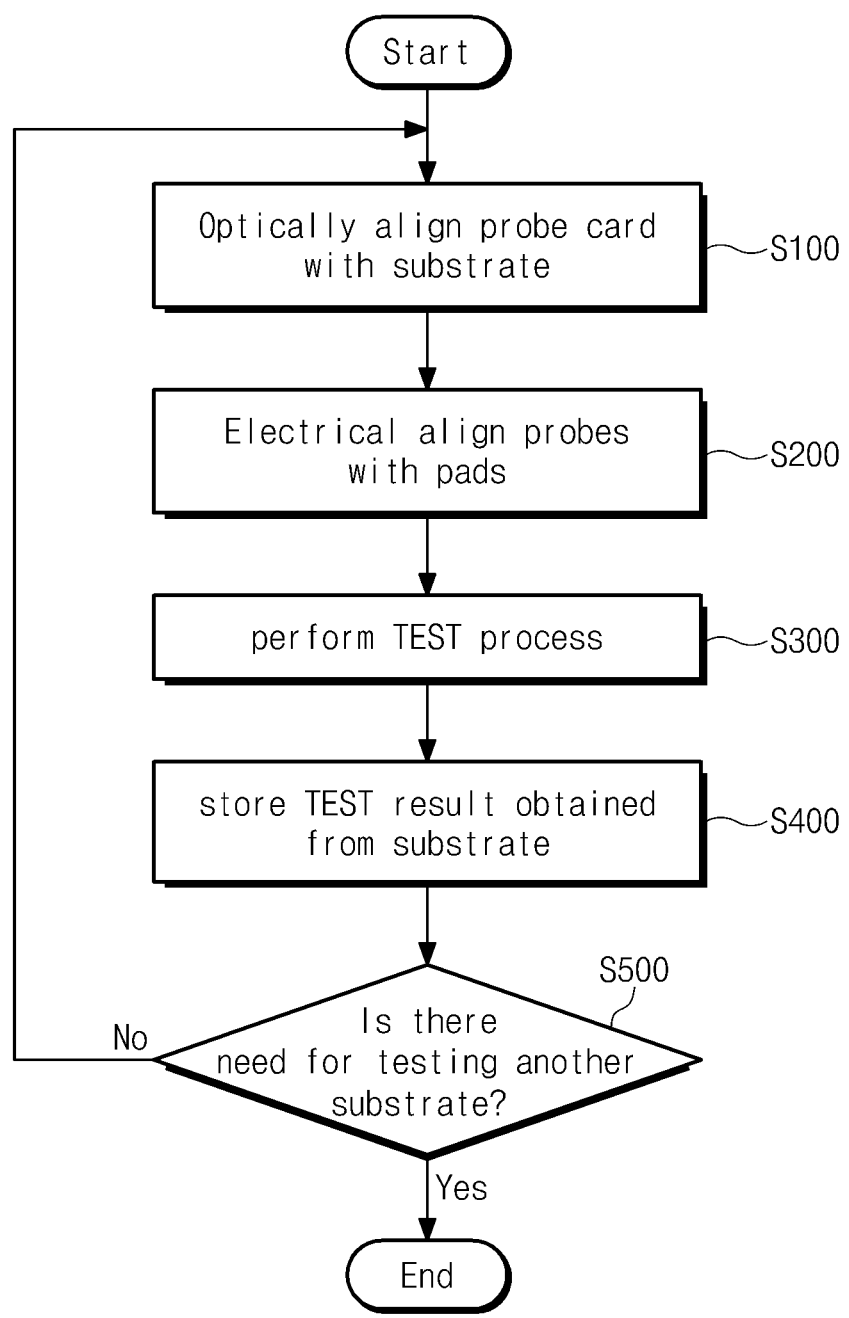
FIG. 9 is a flow chart illustrating a method of testing a semiconductor device.

FIG. 9 is a flow chart illustrating a method of testing a semiconductor device.

Referring to FIG. 9, the substrate 10 may be aligned with the probe card 220 using an optical method (in S100). For example, the position detection unit 240 may examine positions of the substrate 10 and the probe card 220 using optical components (e.g., first and second cameras 242 and 244). Based on the examined position data, the position control unit 250 may adjust alignment between the substrate 10 and the probe card 220. The alignment between the substrate 10 and the probe card 220 may be adjusted using alignment marks (not shown) provided thereon. For example, the optical alignment between the pads 80 and the probes 222 may have an alignment error (not shown) ranging from about 1 μm to about 10 μm. For example, the alignment probe 224 may be positioned within the boundary pad 54 using an optical alignment method.

Next, the pads 80 may be aligned with the probes 222 using an electrical method (S200). For example, electrical connections between the pads 80 and the probes 222 may be examined to adjust the alignment between the pads 80 and the probes 222.

Figure 10:
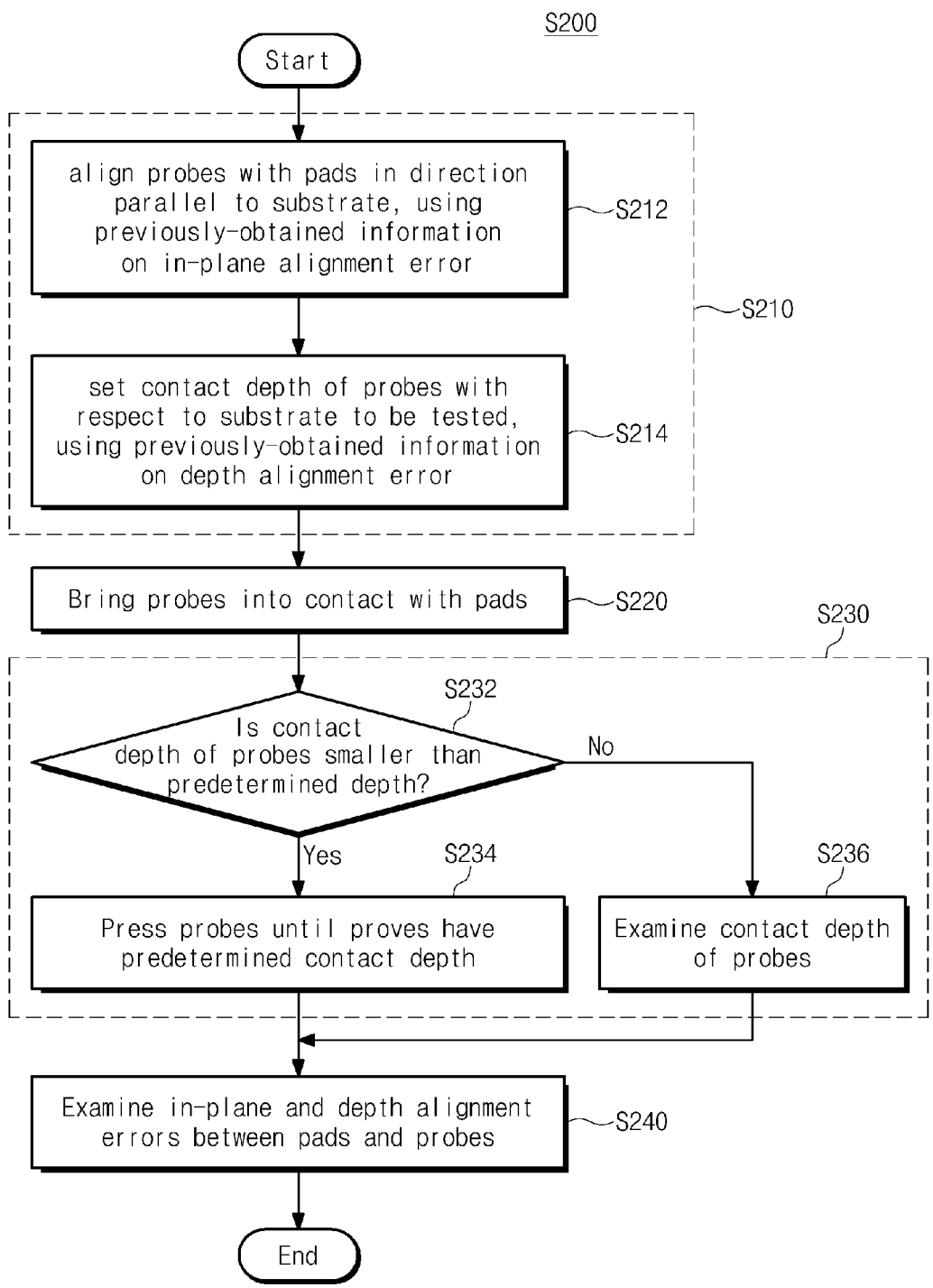
FIG. 10 is a flow chart illustrating a step of aligning probes to pads, according to example embodiments of the inventive concept.

FIG. 10 is a flow chart illustrating the step S200, e.g., in FIG. 9, of aligning the probes 222 to the pads 80, according to example embodiments of the inventive concept. In example embodiments, the step S200 may include a step S210 of electrically aligning the pads 80 with the probes 222, a step S220 of bringing the probes 222 into contact with the pads 80, a step S230 of adjusting a depth of the probes 222, and a step S240 of examining any alignment error 48 between the pads 80 and the probes 222.

In the step S210, the alignment between the pads 80 and the probes 222 may be adjusted in more precise manner, when compared to that of the optical alignment method. In example embodiments, the step S210 may include at least one of an in-plane alignment step S212 and a depth alignment step S214.

In the in-plane alignment step S212, the probes 222 may be aligned with the pads 80 of the substrate 10 to be tested, using previously-obtained information on the in-plane alignment error 47, such as in-plane alignment errors detected from previous measurements in association with testing other semiconductor devices 100 of the same type. An optical alignment error of the substrate 10 to be tested may be compensated or reduced in advance by the previously-obtained information on the in-plane alignment error 47.

In the depth alignment step S214, a contact (or insertion) depth of the probes 222 may be set to have a specific value with respect to the pads 80 of the substrate 10 to be tested. The contact or insertion depth of the probes 222 may be set to remove the depth alignment error 49 which has been obtained in previous test process, such as from previous measurements in association with testing other semiconductor devices 100 of the same type.

In the step S220, the probes 222 may be brought into contact with pads 80 at least at the top surface of the pads. Thereafter, the method described with reference to FIG. 8 may be performed to align the probes 222 with the pads 80 of the substrate 10 to be tested, in a direction parallel to the top surface of the substrate 10. Alternatively, the XY location of the probes 222 may be left unchanged even if a misalignment (e.g., XY misalignment) is detected for the remainder of the testing of this semiconductor device, and the detected misalignment may be used to correct the probe contact locations of later tested semiconductor devices (which may or may not be a semiconductor device of the same type, e.g., having the same integrated circuit and other structure). Thus, the probes 222 may be in contact with the pads 80, respectively, with a reduced or without the in-plane alignment error 47.

In the step S230, the contact depth of the probes 222 may be more precisely adjusted. In example embodiments, the step S230 may include a step S232 of examining whether there is a need for adjusting the contact depth of the probes 222, a step S234 of pressing the probes 222, and a step S236 of examining the contact depth of the probes 222. For example, the step S232 may be performed to examine whether the contact depth of the probes 222 is smaller than a predetermined depth. For example, by the method described with reference to FIG. 8, the position detection unit 240 may examine whether the alignment probe 224 is in contact with the third inner pad 66. The position detection unit 240 may receive a data of the contact depth of the probes 222 from the server 300. If the contact depth of the probes 222 is smaller than the predetermined depth, a pressure may be applied to the pads 80, in the step S234, until the contact depth of the probes 222 has the predetermined depth. Otherwise, the contact depth of the probes 222 may be measured by the position detection unit 240, in the step S236. If the probes 222 are in contact with the pads 80, there may be a difficulty in separating or moving the probes 222 from the pads 80. Accordingly, the contact depth of the probes 222 may be stored in a database and may be used in a subsequent process of aligning the probe card 200 with the substrate 10. For example, if the probes 222 have a predetermined contact depth, subsequent steps of the testing process may be performed on the substrate 10 to be tested without any depth alignment error. However, if the probes 222 have a contact depth greater than the predetermined depth, the subsequent steps of the testing process may suffer from the depth alignment error. In example embodiments, the position detection unit 240 and the server 300 may be used to determine and store the depth alignment error of the substrate 10 to be tested.

The position detection unit 240 may examine the electric alignment error 48 between the probes 222 and the pads 80 to be tested (in S240). In some cases, the electric alignment error 48 may contain information on both the in-plane and depth alignment errors 47 and 49 of the substrate 10 to be tested. Alternatively, the electric alignment error 48 may contain information on only one of the in-plane and depth alignment errors 47 and 49 of the substrate 10 to be tested. The electric alignment error 48 may be stored in the server 300 and/or the database.

Referring back to FIG. 9, the unit device 16 on the substrate 10 of the semiconductor device may be tested by the tester 230 to examine whether the unit device 16 has a failure in electric or operational characteristics (in S300). The test result of the semiconductor device 100 obtained by the tester 230 may be stored in the server 300 (in S400). If the semiconductor device 100 has a correctable defect revealed by the testing in S300 (e.g., defective memory cells that may be replaced by redundant memory cells), the semiconductor device may be repaired. Semiconductor devices 100 that pass testing in S300 or those that have defects that are corrected may then be packaged in a semiconductor package. The packaging may include mounting the semiconductor device 100 on a package substrate (alone or as part of a chip stack) and connecting pads of the semiconductor device (such as pads 40) to terminals of the package substrate and encapsulating the semiconductor device 100 on the substrate. The electric alignment error 48 obtained from the substrate 100 may be used to facilitate alignment between the probe card 200 and another substrate to be tested in a subsequent testing process.

The server 300 may examine whether there is a need for testing another substrate (in S500). If there is no need to test another substrate, the testing process may be terminated. If there is any substrate to be tested, the steps from S100 to S500 may be repeatedly performed by the tester 230, the alignment module 260, and the server 300. As the test process is repeated, the electric alignment error 48 between the probes 222 and the pads 80 may be reduced more and more by the alignment module 260 and the server 300.

According to example embodiments of the inventive concept, a semiconductor device may include XY-measuring pads and Z-measuring pads that are electrically connected to signal pads. Accordingly, in the case where a probe is in contact with one of the XY- and Z-measuring pads, alignment errors in both horizontal and vertical directions between a probe card and a semiconductor device can be examined by measuring or detecting an electrical signal (e.g., current or a voltage) provided through signal pads. In other words, it is possible to align the probes three-dimensionally with the signal pads.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including a plurality core regions and a peripheral region between the plurality of core regions, the plurality core regions each having a plurality of memory cells;
insulating layers on the substrate;
interconnection lines disposed in the insulating layers and connected to the plurality of memory cells; and
pads disposed on the insulating layers at the peripheral region,
wherein the pads comprise:
signal pads connected to the plurality of memory cells by the interconnection lines; and
a first alignment pad spaced apart from the signal pads, wherein the first alignment pad comprises a plurality of sub-pads connected to the signal pads by the interconnection lines individually and disposed within an area equal to an area occupied by one of the signal pads.

2. The device of claim 1, wherein the sub-pads of the first alignment pad comprise a plurality of XY-measuring pads spaced apart from each other in a horizontal direction to detect a horizontal misalignment of the probes with respect to the signal pads.

3. The device of claim 2, wherein, with respect to a top-down view, the XY-measuring pads of the first alignment pad are positioned in a two-dimensional array, the two-dimensional array of XY-measuring pads has a first outer boundary, one of the signal pads has a second outer boundary, and the area within the first outer boundary is substantially equal to the area within the second outer boundary.

4. The device of claim 2, wherein the XY-measuring pads further comprises a contiguous boundary pad encompassing all remaining ones of the XY-measuring pads.

5. The device of claim 4, wherein the contiguous boundary pad has a rectangular ring shape having an outer perimeter encompassing an area that is larger than each of at least a majority of the signal pads.

6. The device of claim 1, wherein the first alignment pad further comprises a vertical stack of Z-measuring pads disposed in the insulating layers and to detect a depth of a probe.

7. The device of claim 6, further comprising:
contact plugs penetrating the insulating layers and connected to interconnection lines,
wherein the Z-measuring pads have holes through which the contact plugs pass without contacting the Z-measuring pads.

8. The device of claim 1, further comprising a plurality of alignment pads including the first alignment pad, wherein the plurality of alignment pads each comprise a plurality of spaced apart sub-pads disposed at positions to determine a misalignment between the signal pads and probes to contact with the signal pads.

9. The device of claim 1, wherein the first alignment pad comprises:
a plurality of XY-measuring pads spaced apart from each other in a horizontal direction to detect a horizontal misalignment of the probes with respect to the signal pads; and
Z-measuring pads to detect a depth of the probes,
wherein the signal pads comprise:
XY signal pads each connected to a corresponding one of the XY-measuring pads; and
Z signal pads each connected to a corresponding one of the Z-measuring pads.

10. The device of claim 1, further comprising an integrated circuit and a buffer, wherein the buffer is electrically connected to at least one of the signal pads to provide an information signal therebetween.

11. An apparatus for testing a semiconductor device comprising signal pads and an alignment pad including a plurality of measurement pads connected to signal pads individually, the plurality of measurement pads disposed in an area equal to an area occupied by one of the signal pads, the apparatus comprising:
a chuck configured to support the semiconductor device;
a probe card including a plurality of probes, including an alignment probe and signal probes, the alignment probe being configured to contact a center of the alignment pad of the semiconductor device and the signal probes being configured to contact centers of corresponding signal pads;

a tester configured to provide a test signal to the alignment probe and to obtain alignment data by detecting a contact of an alignment probe to at least one of the measurement pads using one of the signal pads to which the at least one of the measurement pads is connected when the alignment probe contacts the alignment pad and the signal probes contact the signal pads; and an alignment module configured to align the signal probes with the centers of the signal pads in response to the alignment data.

12. The apparatus of claim 11, wherein the tester is configured to obtain the alignment data by detecting an electrical signal provided between the alignment probe and a signal probe.

13. The apparatus of claim 12, wherein the alignment module comprises:

a position control unit configured to adjust alignment of the probes in response to the alignment data.

14. The apparatus of claim 13, wherein the position control unit is configured to move chuck and the probe card toward each other in response to the alignment data.

15. The apparatus of claim 13, further comprising cameras for acquiring position information of the relative position of the semiconductor device and the probe card.

16. A semiconductor device, comprising:
an integrated circuit;
an insulating layer;
a plurality of signal pads disposed on the insulating layer and connected to the integrated circuit; and
a plurality of probe measurement pads on the insulating layer, each of the plurality of probe measurement pads being electrically connected to a corresponding one of the signal pads, the plurality of probe measurement pads being disposed in an area equal to an area occupied by one of the signal pads.

17. The semiconductor device of claim 16, wherein the plurality of signal pads and plurality of probe measurement pads are formed of the same metal material at the same height in the semiconductor device.

18. The semiconductor device of claim 17, wherein the plurality of signal pads and plurality of probe measurement pads are exposed from the insulating layer, and the insulating layer is the uppermost insulating layer of the semiconductor device.

19. The semiconductor device of claim 16, wherein each of at least a majority of the plurality of signal pads, as viewed from a top down perspective, has a size substantially equal to a first area, and the plurality of probe measurement pads comprise an array of probe measurement pads positioned in a region having a size substantially equal to the first area.

20. The semiconductor device of claim 16, wherein the probe measurement pads comprise a vertical stack of measurement pads embedded within the insulating layer.

* * * * *